United States Patent [19]

Josefowicz et al.

[11] Patent Number: 5,079,179
[45] Date of Patent: Jan. 7, 1992

[54] PROCESS OF MAKING GAAS ELECTRICAL CIRCUIT DEVICES WITH LANGMUIR-BLODGETT INSULATOR LAYER

[75] Inventors: Jack Josefowicz, Westlake Village; David Rensch, Thousand Oaks; Vladimir Rodov, Redondo Beach; Meir Bartur, Los Angeles; Debra Marr-Leisy, Long Beach, all of Calif.

[73] Assignee: Hughes Aircraft Company, Los Angeles, Calif.

[21] Appl. No.: 618,578

[22] Filed: Nov. 27, 1990

Related U.S. Application Data

[60] Division of Ser. No. 370,528, Jun. 23, 1989, abandoned, which is a continuation-in-part of Ser. No. 342,495, Apr. 24, 1989, abandoned, which is a continuation-in-part of Ser. No. 107,082, Oct. 9, 1987, abandoned.

[51] Int. Cl.$^5$ .......................................... H01L 21/265
[52] U.S. Cl. ........................................ 437/41; 437/40; 437/225; 437/235; 437/228
[58] Field of Search .................. 357/23.2; 437/1, 40, 437/41, 225, 235, 941, 946

[56] References Cited

U.S. PATENT DOCUMENTS 4,641,161 2/1987 Kim et al. ..................... 357/23.2

FOREIGN PATENT DOCUMENTS

| 0246602 | 9/1983 | European Pat. Off. |
| 0244835 | 6/1987 | European Pat. Off. |
| 0239368 | 9/1987 | European Pat. Off. |
| 62-65471 | 3/1987 | Japan ................ 357/23.2 |
| 8303165 | 9/1983 | World Int. Prop. O. ........ 357/23.2 |

OTHER PUBLICATIONS

Tredgold et al., "GaAs Schottky Diodes Incorporating Langmuir-Blodgett Layers of Pre-Formed Polymers", Dec. 1985, Journal of Physics, D: Applied Physics, vol. 18, No. 12, pp. 2483-2487.
Roberts, "INP/Langmuir Film MISFET"; Solid State and Electron Devices; vol. 2, No. 6 (1987); pp. 169-175.
Offsey; "Unpinned (100) GaAs Surfaces in Air using Photochemistry", Appl. Phys. Lett. 48(7); 1986; pp. 475-477.
Lloyd; "Amorphous Silicon/Langmuir-Blodgett Film Field Effect Transistor"; Thin Solid Films, 99 (1983); 297-304.
Kuhn; "Functionalized Monolayer Assembly Manipulation"; Thin Solid Films, 99 (1983); pp. 1-16.
Tredgold; "Increase of Schottky Barrier Height at GaAs Surfaces by Carboxylic Acid Monolayers and Multilayers"; Phys. D: Appl. Phys. 18 (1985) 103-109.
"Ga/As LB Film Miss Switching Device"; Thomas; Electron. Letters; vol. 20, No. 20 (1984); pp. 838-839.
Fung; "Planar Silicon Field Effect Transistors with Langmuir-Blodgett Gate Insulators"; Thin Solid Films, 132 (1985); 33-39.

Primary Examiner—Brian E. Hearn
Assistant Examiner—Trung Dang
Attorney, Agent, or Firm—Paul M. Coble; W. K. Denson-Low

[57] ABSTRACT

A GaAs circuit structure is described which interposes a Langmuir-Blodgett (L-B) layer between the substrate and a conductive contact. The thickness of the layer is controlled to determine the operating characteristics of the device. The head group of the L-B molecule is chosen so that it passivates the surface states of the particular GaAs substrate being used. Certain preferred acids and amino head groups are disclosed. The L-B layer has been found to both increase the gate barrier height for an FET, and to passivate dangling bonds and surfaces defects in the GaAs substrate to enable inversion mode operation. Specific FET and diode devices are described.

15 Claims, 2 Drawing Sheets

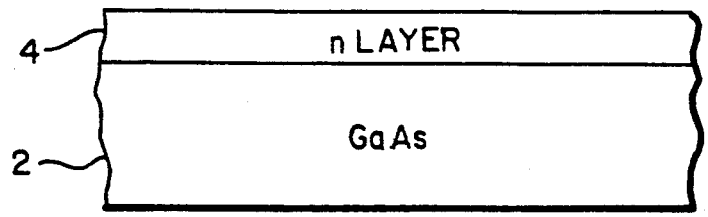
FIG.I.A.
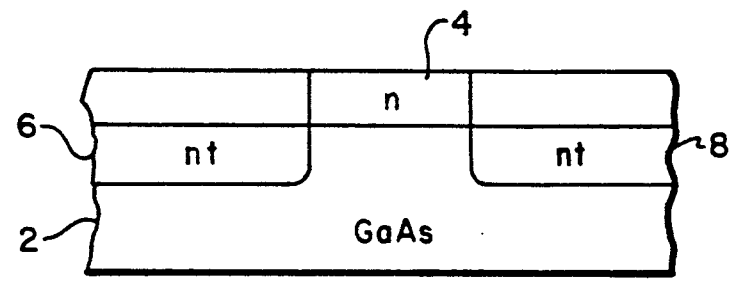
FIG.I.B.
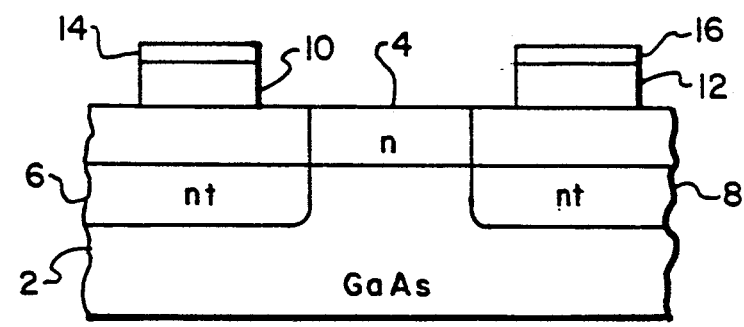
FIG.I.C.
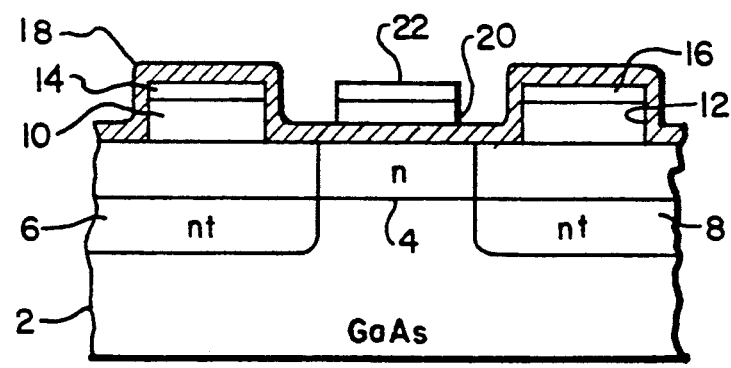
FIG.I.D.
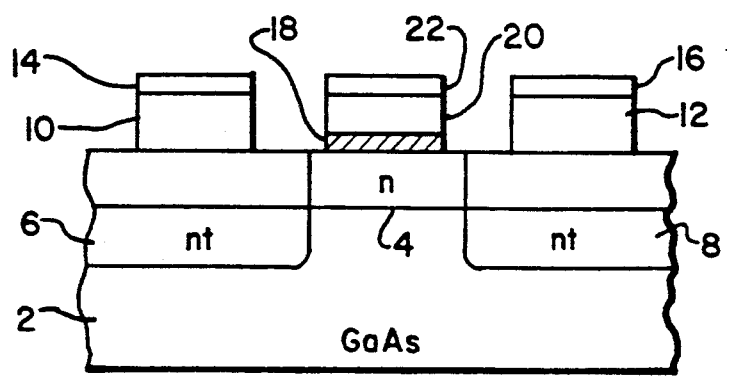
FIG.I.E.

PROCESS OF MAKING GAAS ELECTRICAL CIRCUIT DEVICES WITH LANGMUIR-BLODGETT INSULATOR LAYER

This application is division of Ser. No. 07/370,528, filed Jun. 23, 1989, now abandoned a continuation-in-part of U.S. patent application Ser. No. 07/342,495 filed on Apr. 24, 1989, now abandoned which is a continuation-in-part of U.S. Ser. No. 107,082 filed on Oct. 09, 1987, now abandoned.

BACKGROUND OF THE INVENTION

1. Field of the Invention

This invention relates to electrical circuit devices such as field effect transistors (FETs), and more particularly to such devices and a method of fabricating the same on a gallium arsenide (GaAs) substrate.

2. Description of the Related Art

GaAs devices have been developed which offer considerably higher speed operation than other semiconductor materials, for both discrete devices and digital integrated circuits. However, GaAs is a difficult material to work with because its surface is typically characterized by dangling bonds and surface defects which seriously limit the range of the gate voltage that can be applied to an FET. Present GaAs technology limits the positive gate voltage swing to between about 0 and 0.7 volts. This places severe noise margin limits of about 20 to 30 mV on devices with threshold voltages near 0 Volts, and imposes rigid controls on circuit designs and processing.

Whereas other semiconductor materials such as silicon and indium phosphide can support metal-oxide semiconductor FETs (MOSFETs), attempts to use GaAs with a deposited dielectric (e.g., $SiO_2$) as a gate insulator have resulted in large surface state and surface defect densities. This in turn "pins" the Fermi level to about 0.8 eV below the conduction band such that it cannot be controlled by the gate voltage. To avoid this, the gate contact is made directly to the semiconductor substrate surface to form a Schottky junction rather than forming a dielectric insulating layer between the gate contact and the channel as with silicon or InP. Unsuccessful attempts have been made for many years to locate or devise a dielectric that can successfully passivate the surface states encountered with GaAs. This problem is discussed in greater detail in S. D. Offsey et al., "Unpinned (100) GaAs Surfaces in Air Using Photochemistry," Applied Physics Letter 48 (7) pp. 475 (Feb. 1986).

The attainment of larger gate voltage swings would greatly improve the prospects of being able to use GaAs in large complex digital integrated circuits. Another desired application for GaAs devices would be to use them in an inversion mode. The "pinning" of the Fermi level prevents GaAs devices from being operated in an inversion mode.

For silicon and InP devices in which gate insulators are commonly used, investigations have been reported concerning the use of Langmuir-Blodgett (L-B) films as the insulating medium. L-B films are formed from amphophilic molecules with a hydrophobic "tail" and an ionizable "head", and are reported for example in an article by Hans Kuhn, "Functionalized Monolayer Assembly Manipulation", Thin Solid Films, 99, pp. 1 (1983). A laboratory set-up was reported for InP by G. G. Roberts, et al., Solid State & Electron Devices, "InP/Langmuir-film m.i.s.f.e.t.", Vol. 2, No. 6, pp. 169, Nov. 1978. In the described set-up, source and drain electrodes were evaporated onto an InP surface, with a gap between the source and drain defined by a tungsten wire which acted as a shadow mask. An L-B film was substituted for $SiO_2$ as the gate insulator. The described fabrication process resulted in relatively large scale devices and was not applicable to small integrated circuit processing for microelectronics. A comparable laboratory approach for forming rudimentary silicon devices with L-B film substituted for the usual $SiO_2$ gate insulator was described in Lloyd, et al., "Amorphous Silicon/Langmuir-Blodgett Film Field Effect Transistor", Thin Solid Films, Vol. 99, pp. 297 (1983). Neither of these reports, however, was suggested as being applicable to GaAs, which heretofore has not been capable of supporting an insulating gate layer.

SUMMARY OF THE INVENTION

In view of the problems previously encountered with GaAs devices, the purpose of the present invention is to provide an electrical circuit structure employing a GaAs substrate, and in particular an FET device, in which the gate voltage is increased beyond 0.7 volts without the accompanying problems of an excessively high surface state density and with an increase in noise immunity.

The invention also seeks to produce a GaAs FET which is compatible with inversion mode operation and accompanying higher voltage swings, and to provide a fabrication method for GaAs devices which successfully meets all of these criteria and is compatible with IC processing.

In accordance with the invention, an L-B layer is formed over a portion of a GaAs substrate, with a conductive contact overlying and contacting at least a portion of the L-B layer. The L-B layer can be fabricated as either a single film about 30 angstroms thick or as a composite of multiple L-B films each about 30 angstroms thick. These latter types of devices are capable of MISFET-type operation, with the L-B layer functioning as a gate insulator and also passivating dangling bonds and surface defects in the GaAs.

The choice of the particular L-B molecules used in the L-B film depends in part upon the surface state charge of the particular GaAs substrate surface being used. Once the surface state charge is known, a particular L-B molecule is chosen which at least partially passivates the portion of the substrate surface in contact with the L-B layer. The selection of the L-B molecule is in part based upon the dissociation constant of the L-B molecule's unmodified or modified head group. For positive surface state charges, an L-B molecule is chosen such that the dissociation constant for the non-ionized form of its head group is greater than or equal to about $10^{-7}$. These head groups are acidic. The unmodified acidic head group is preferably either carboxylic acid or sulfonic acid.

The acidic head group of the L-B molecule may optionally be linked with a modifying group, yielding a modified acidic head group, to change its dissociation constant. Preferred modifying groups are benzene rings and modified benzene rings. The modified benzene ring may, for example, include a bromine atom. Examples of preferred modified acidic head groups include benzene carboxylic acid, orthobromobenzene carboxylic acid, and benzene sulfonic acid.

For negative GaAs surface state charges, an L-B molecule is chosen such that the dissociation constant for the non-ionized form of its head group is less than or equal to about $10^{-7}$. These head groups are basic. The unmodified basic head group is preferably an amino group.

The amino head group of the L-B molecule may optionally be linked with a modifying group, yielding a modified amino head group, to change its dissociation constant. Preferred modifying groups include heterocyclic rings, modified heterocyclic rings, and alkyl groups.

The tail group of the L-B molecule is composed of either 1 or 2 hydrocarbon chains, or, 1 or 2 fluorocarbon chains. The hydrocarbon tail group of the L-B molecule preferably has a chain length of between about 12 and 30 carbon atoms inclusive, with a chain length of between about 18 and 24 carbon atoms being particularly desirable.

The fluorocarbon tail group of the L-B molecule preferably has a chain length of between about 6 and 20 carbon atoms inclusive, with a chain length between 10 and 16 carbon atoms being particularly desirable.

Once the GaAs surface state charge is known, an L-B molecule is selected from one of the above groups of molecules having the desired range of dissociation constants. Some experimentation with different L-B molecules may be necessary to determine the particular L-B molecule that best passivates the GaAs surface states. A stable capacitance versus voltage (C-V) curve indicates that the GaAs surface states have been at least partially passivated.

In fabricating an FET according to the present invention, ohmic metal source and drain contacts are formed on either side of the channel and are coated with a layer of metal, preferably nickel, having a hydrophilicity similar to that of the GaAs. The L-B layer is then formed as a continuous film over both the channel areas and the source and drain contacts, and a gate contact is thereafter made to the portion of the L-B layer over the channel region. The L-B material is then removed from the device except where it is covered by the gate contact. To avoid damaging the L-B layer, the gate contact is formed by depositing a succession of metal layers and cooling the device after each layer has been deposited.

Further features and advantages of the invention will be apparent to those skilled in the art from the following detailed description of preferred embodiments, taken together with the accompanying drawings, in which:

DESCRIPTION OF THE DRAWINGS

FIGS. 1(a)-1(e) are sectional views, not to scale, of successive steps in the fabrication of an FET in accordance with the invention having a single L-B gate film;

DETAILED DESCRIPTION OF PREFERRED EMBODIMENTS

Figure 2:
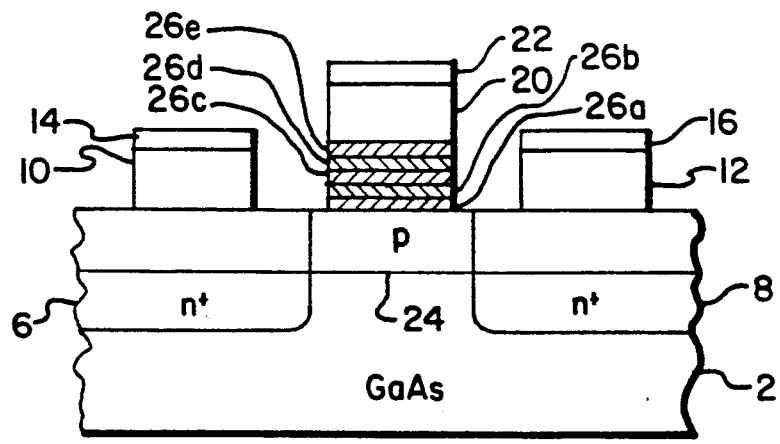
FIG. 2 is a section view, not to scale, of an FET having a multi-film L-B gate layer.

In contrast with prior GaAs devices which have conductive contacts in direct contact with the GaAs substrate via a reverse biased Schottky junction, the present invention interposes an insulative layer between the contact and the substrate. The layer is provided in the form of one or more L-B films, with the aggregate thickness of the films tailored to the intended use of the device.

The preferred fabrication sequence for an FET with a single L-B gate insulating film is shown in FIGS. 1(a)-1(e). The resulting device is comparable to a MESFET (metal-semiconductor FET), but with a greater gate voltage swing than has previously been attainable. Since a partially insulating layer is placed between the gate contact and channel, the device is referred to as a metal-insulator FET (MISFET).

The first step in the fabrication process is to properly prepare the GaAs substrate surface. Although many methods are known to those skilled in the art, one suitable method is discussed in Josefowicz, Jack Y. and Rensch, David B., "High-Temperature Stable W/GaAs Interface and Application to Metal-Semiconductor Field-Effect Transistors and Digital Circuits", *Journal of Vacuum Science Technology*, B5(6), Nov/Dec 1987 page 1708. In the method disclosed in that article, the GaAs substrate surface is initially organically cleaned in acetone and tetrachloroethylene. Surface oxide is then removed in HCL acid, followed by a surface etch in $NH_4OH$ and $H_2O_2$.

After the GaAs surface has been prepared, the substrate is ready for implantation. Referring to FIG. 1(a), a GaAs substrate 2 is shown which includes an n-type silicon channel implant 4. Alternately, boron could be implanted to produce a p-type channel, or other n or p dopants may be implanted. Molecular beam epitaxy or chemical vapor deposition could also be employed to establish the doped channel region 4. The wafer is annealed after the doped layer 4 is formed.

N+ regions 6 and 8 are then implanted into the substrate to provide source and drain regions, respectively, as illustrated in FIG. 1(b). After another anneal, ohmic metal contact pads or bodies 10 and 12 are deposited respectively over the source and drain implants 6 and 8, and annealed (FIG. 1(c)). Contact pads 10 and 12 are typically formed from gold. However, it has been found that LB films tend to develop discontinuities and to break up when deposited over heterogeneous materials such as gold and GaAs. Accordingly, the contact pads 10 and 12 are capped by the deposition of respective layers of metal 14, 16 having a hydrophobicity sufficiently similar to the GaAs surface to permit the formation of a continuous L-B layer in a subsequent step. Nickel is a suitable cap material. Other Group VIII metals with the same valence as nickel, such as platinum and palladium, may also be suitable.

A continuous L-B layer 18 is next deposited over the device by a dip coating method that is consistent with semiconductor clean room practices, as shown in FIG. 1(d).

Although several dip coating methods are known to those skilled in the art, one suitable dip coating method for depositing one or more L-B films is described as follows. A very clean, filtered, deionized water bath at room temperature is used. A sufficient number of the selected L-B molecules are then placed in the bath to create a solid 1-molecule thick, two-dimensional L-B film at the air-water interface. The amount of L-B molecules necessary will of course depend upon the surface area of the water bath. The surface pressure of the L-B molecules must typically be above about 0.02 $Nm^{-1}$ for a solid L-B film to form on the surface of the water bath.

An electronic-grade GaAs substrate is then dipped into the water bath through the L-B film. As the substrate is dipped, the -head groups of the L-B molecules attach themselves to the substrate surface, causing an L-B film to be deposited on the substrate surface.

To deposit a second L-B film, the water bath is replenished with L-B molecules, and the GaAs substrate is either withdrawn from the bath (after its initial insertion to deposit the first L-B film) or it is again dipped into the bath. The tail groups of L-B molecules in the water bath then attach to the tail groups of the molecules in the first L-B film to yield the second L-B film.

A third L-B film is deposited in the same manner as the second L-B film, except that the head groups of L-B molecules in the replenished water bath will now attach to head groups of the molecules in the second L-B film to yield the third L-B film.

The L-B layer 18 consists of a single film, which with present fabrication techniques is about 30 angstroms thick. The invention has been demonstrated using an $\omega$-tricosenoic acid L-B film but, as discussed below, other L-B formulations may be more desirable depending upon the GaAs surface state charge.

The L-B layer 18 forms a continuous film over both the ohmic contacts 10 and 12 and the intervening channel portion of the n- implant 4. If a blanket implant was initially employed, the substrate is preferably treated with an $O_2$ implant before laying down the L-B film to isolate the channels; the $O_2$ is not needed if isolated channel implants are employed.

Still referring to FIG. 1(d), a gate contact 20 is next formed over the portion of the L-B layer in alignment with the channel from aluminum or other suitable metal. The gate contact is preferably established by evaporating a film of the contact metal over the entire wafer, followed by the evaporation of a nickel cap 22 over the gate contact portion of the evaporated aluminum. The nickel cap acts as a mask, permitting the aluminum to be etched away except under the cap. The aluminum layer is preferably about 1,000 angstroms thick. To avoid damaging the underlying L-B layer from the heat associated with the aluminum evaporation, five successive evaporations of aluminum are preferably performed, each about 200 angstroms thick. The wafer is permitted to cool after each layer is formed while the evaporator is turned off. Alternately, a low temperature evaporation process can be employed. One disadvantage of aluminum is a tendency to oxidize. Other metals could be substituted for the gate contact, with an L-B layer that could withstand higher temperatures than those associated with aluminum evaporation.

In the final step of fabrication, illustrated in FIG. 1(e), the exposed L-B layer is removed, preferably with an $O_2$ plasma, leaving only the portion of the L-B layer below the gate contact 20. The gate contact itself is typically about 2 microns wide, while the source and drain contacts 10, 12 are typically separated by about 5 microns. In a particular implementation the n-channel implant was implanted with $Si^{28}$ at a density of $5 \times 10^{12}/cm^2$ and an implant energy of 70 KeV to form a depletion mode device. Its transconductance was determined to be about 15 mS/mm, and there was no indication of gate leakage current with a gate bias of 2 volts. By contrast, a similar aluminum gate MESFET without the L-B layer was found to have a transconductance of about 23 mS/mm, and gate leakage current resulted from gate biases in excess of 0.8 volts.

A similar FET employing the techniques of the invention is shown in FIG. 2, in which elements which are the same as in FIGS. 1(a)-1(e) are identified by the same reference numerals. The device shown in FIG. 2 is capable of "inversion mode" operation. This is the type of operation obtained with a MOSFET, in which the gate contact is separated from the channel by an insulating oxide layer. For a p-channel MOSFET, the source and drain are doped n-type while the channel is doped p-type. A positive gate voltage attracts electrons into the channel area adjacent the insulator layer, thereby permitting conduction between the source and drain. In the device of FIG. 2, the channel 24 is doped p-type. A plural succession of L-B layers 26a, b, c, d and e separate the gate contacts 20 from channel 24. The device is fabricated in a manner similar to that illustrated in FIGS. 1(a)-1(e), but 5 L-B films are laid down in succession to provide a thicker L-B composite layer. A different number of L-B films could be used, but with each film being about 30 angstroms thick. Thus, the composite L-B layer insulates the gate contact 20 from the underlying channel 24.

It has also been discovered that the L-B material provides the distinct advantage of passivating dangling bonds and surface defects in the underlying GaAs channel. As noted previously, dangling bonds and surface defects have been long standing problems that have prevented the fabrication of MISFET-type devices with GaAs. The solution of this problem with the present invention opens up an entirely new area of circuit design. By lowering the surface state density of the GaAs such that its surface is not "pinned" at 0.8 Ev below the conduction band, voltage swings in the 1-4 volt range can be tolerated. One result of this improvement is the ability to offer better device performance for digital signal processing, thereby allowing VLSI circuits to be produced due to improved noise immunity and larger achievable gate voltage.

It is currently believed that the mechanism by which the GaAs dangling surface bonds and surface defects are passivated operates as follows. A preferred L-B molecule has an ionizable "head" group and a hydrocarbon "tail" group. The L-B molecules are placed in a very clean water bath into which the GaAs substrate is subsequently dipped. The L-B molecules ionize in the water and form a film on the water. The L-B molecule's head group, depending upon its particular dissociation constant, either gives up or accepts a proton when it ionizes with water. The dissociation constant is related to the ease with which the head group will give up a proton in an aqueous environment. If the head group has a dissociation constant of about $10^{-7}$ or greater (i.e. it is acidic), it will ionize in water by giving up a proton to the water in an ion exchange reaction, yielding a negative acidic head group ion and a position charged hydronium $H_3O^+$ ion. If the L-B molecule's head group has a dissociation constant of less than or equal to about $10^{-7}$ (i.e. it is basic), it will ionize by accepting a proton from the water in an ion exchange reaction, yielding a positive basic head group ion and a hydroxide ion, $OH^-$.

The type of L-B head group which is selected to passivate the GaAs surface depends upon the particular GaAs surface state charge and the density of that charge. The GaAs surface quality and surface state charge characteristics are highly dependent upon the particular type of fabrication procedure used, and varies with factors such as etching, polishing, chemical treatment and the degree of oxidation employed.

Regardless of which GaAs surface fabrication procedure is used, the charge and charge density of the GaAs surface should be measured. If the measured surface charge is positive, the selected L-B molecule should have an acidic head group (having a dissociation constant of greater than or equal to about $10^{-7}$) since the negatively-ionized acidic head group in the aqueous solution will tend to react with the positive charge on the GaAs surface, thereby at least partially passivating the GaAs surface states. The acidic head group reacts with the water and gives up a proton to the water. The positively charged water molecule is then exchanged by the head group for a positive charge from the positive GaAs surface.

Examples of preferred acid head groups for the L-B molecules include carboxylic acid (dissociation constant = $1 \times 10^{-5}$), and, sulfonic acid (dissociation constant = $2 \times 10^{-1}$). The invention has been demonstrated with $\omega$-triconsenoic acid (dissociation constant = $1.3 \times 10^{-5}$). For a discussion of dissociation constants, see *Handbook of Chemistry and Physics*, 64th edition, CRC Press, 1984, pages D-164 to D-168.

The acidic head group may optionally be linked with a modifying group to change its dissociation constant, yielding a modified acidic group. Preferred modifying groups are benzene rings and modified benzene rings. The modified benzene ring may, for example, include a bromine atom. Examples of preferred modified acidic head groups include benzene carboxylic acid (dissociation constant = $7 \times 10^{-5}$), ortho-bromobenzene carboxylic acid (dissociation constant = $2 \times 10^{-3}$), and benzene sulfonic acid (dissociation constant = $2 \times 10^{-1}$).

If the measured GaAs surface charge is negative the selected L-B molecule should have a basic head group (having a dissociation constant less than or equal to about $10^{-7}$) since the positively-ionized basic head group in the aqueous solution will tend to react with the negative charge on the GaAs surface, thereby at least partially passivating the GaAs surface states. The amino head group accepts a proton when it reacts with the water. The negatively charged hydroxide ion is then exchanged by the head group for a negative charge from the negative GaAs surface.

An amino group (dissociation constant = $2 \times 10^{-11}$) is preferred as the basic head group for the L-B molecules. The amino head group may optionally be linked with a modifying group to change its dissociation constant, yielding a modified amino head group. Preferred modifying groups include morpholine rings (dissociation constant = $5 \times 10^{-9}$), modified morpholine rings, and quatnary amines.

Once it is determined whether an acidic or basic head group is necessary to passivate the GaAs surface charges, some experimentation may be required to determine which particular L-B molecule best passivates the surface states of the particular GaAs surface being used. No precise mathematical relationship is known between the GaAs surface charge and the head group's dissociation constant which would assist a person in selecting the proper L-B molecule from one of the above groups, except for the above-described relationships.

A more precise empirical relationship or model should be obtainable based upon experimentation in which different GaAs surface charge densities are matched with different L-B molecules to see which L-B molecule best passivates the particular GaAs surface states.

Once the experimental L-B film is deposited on a particular GaAs surface followed by the deposition of a metal contact, the surface passivation can be verified by measuring the capacitance - voltage characteristics of the capacitor. A stable capacitance versus voltage (C-V) curve indicates that the GaAs surface states have been at least partially passivated.

Figure 3:
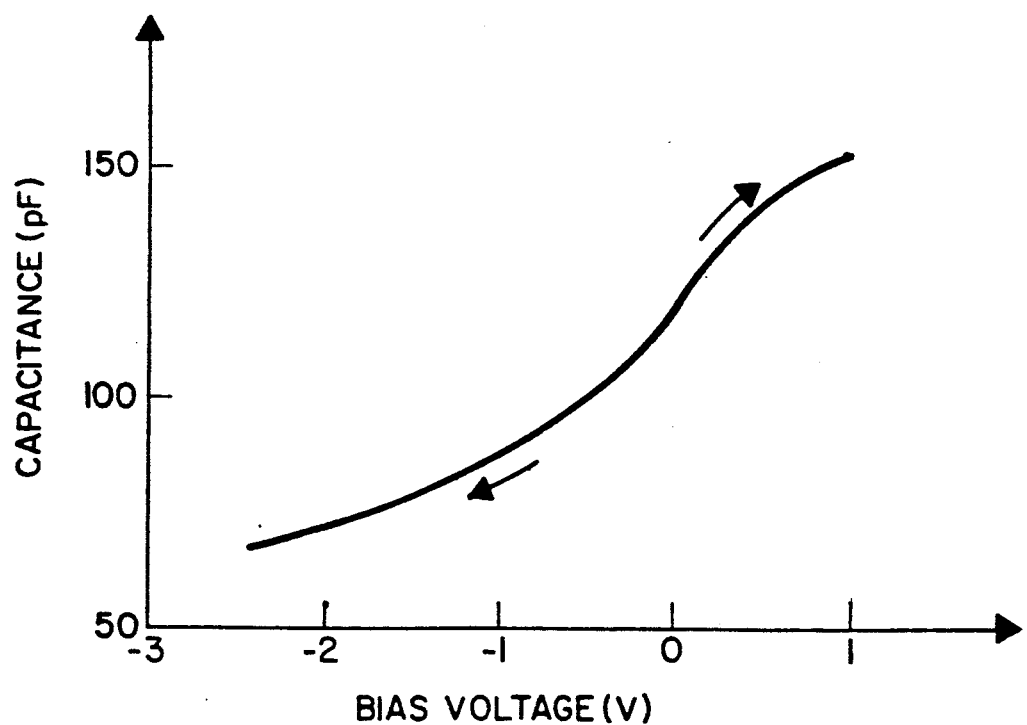
FIG. 3 is a capacitance-voltage (C-V) graph for an MIS capacitor formed in accordance with the invention.

A capacitance-voltage trace for a capacitor with a single L-B film is shown in FIG. 3. This exhibits the characteristic shape of an MIS (metal-insulator-semiconductor) capacitor with a transition from accumulation to depletion. The flat band voltage which occurs in the vicinity of zero volts implies a lowering of interface states or unpinning of the GaAs surface.

Each preferred L-B molecule also has a hydrocarbon or fluorocarbon "tail" group. The hydrocarbon tail group should have a chain length of between about 12 and 30 carbon atoms inclusive for increased L-B film stability, with a chain length of between about 18 and 24 carbon atoms being particularly desirable. For example, the L-B molecule $\omega$-triconsenoic acid has a hydrocarbon tail group with 22 carbon atoms.

A novel type of semiconductor device has thus been shown and described which combines the fast response of GaAs with the advantages of gate insulation that have heretofore been unobtainable with GaAs. While several illustrative embodiments of the invention have been shown and described, numerous variations and alternate embodiments will occur to those skilled in the art without departing from the spirit and scope of the invention. The invention is applicable in general to GaAs devices in which an insulating or barrier layer is desirable between a contact and the substrate. For example, the described technique is also compatible with the fabrication of self-aligned substitutional gate MISFETs. Accordingly, it is intended that within the scope of the appended claims the present invention may be practiced otherwise than as specifically described.

We claim:

1. A method of forming an electrical circuit structure with a Langmuir-Blodgett (L-B) insulating layer on a semiconductor substrate, comprising:

determining the polarity and density of surface charge on the substrate, selecting a L-B material having a head group with a polarity in solution opposite to the polarity of the substrate surface charge, and a dissociation constant that yields a charge density in solution which substantially matches that of the substrate surface charge, forming a solution of said L-B material, and applying said solution to the semiconductor substrate to form a L-B layer on the substrate which substantially passivates the substrate's surface charge.

2. The method of claim 1, wherein the head group of the L-B material is linked with a modifying group to modify its dissociation constant to substantially match the substrate surface charge.

3. The method of claim 2, wherein the L-B material's head group is acidic, and its modifying group is a benzene ring or a modified benzene ring.

4. The method of claim 3, wherein the modifying head group is a modified benzene ring which includes a bromine atom.

5. The method of claim 3, wherein said modifying group is a member of the group consisting of benzene carboxylic acid, ortho-bromobenzene carboxylic acid and benzene sulfonic acid.

6. The method of claim 2, wherein the L-B material's head group is basic and comprises an amino group, and its modifying group is a morpholine ring, a modified morpholine ring or quatnary amine.

7. The method of claim 1, wherein the L-B material's head group is acidic and is a member of the group consisting of carboxylic acid, sulfonic acid and ω-tricosenoic acid.

8. The method of claim 1, wherein the L-B material's head group is basic and comprises an amino group.

9. The method of claim 1, wherein said substrate comprises gallium arsenide.

10. The method of claim 1, further comprising the steps of:
   establishing source, drain and channel areas in the substrate,
   forming ohmic contact bodies on said source and drain areas of the substrate,
   forming caps having a predetermined hydrophobicity on said contact bodies,
   forming said L-B layer as a substantially continuous layer over said contact bodies and the channel area of the substrate, said L-B layer directly contacting the caps on said contact bodies and the substrate surface over said channel area, the hydrophobicity of said caps being sufficiently similar to that of the substrate to enable the formation of said L-B layer as a substantially continuous layer, and
   removing the L-B layer except under said channel area contact.

11. The method of claim 10, wherein said substrate is formed from gallium arsenide and said caps are formed from nickel or another Group VIII metal having the same valence as nickel.

12. A method of forming an insulated gate field effect transistor, comprising:
   establishing source, drain and channel areas in a semiconductor substrate,
   forming ohmic contact bodies on said source and drain areas of the substrate, said ohmic contact bodies having a hydrophobicity dissimilar to that of the substrate,
   forming caps on said contact bodies having a predetermined hydrophobicity,
   forming a substantially continuous Langmuir-Blodgett (L-B) layer over said contact bodies and the channel area, said L-B layer directly contacting the caps on said contact bodies and the substrate surface over said channel area, the hydrophobicity of said caps being sufficiently similar to that of the substrate to enable the formation of said L-B layer as a substantially continuous layer,
   forming a contact to the L-B layer over said channel area, and
   removing the L-B layer except under said channel area contact.

13. The method of claim 12, wherein said substrate is formed from gallium arsenide and said caps are formed from nickel or another Group VIII metal having the same valence as nickel.

14. A method of forming a plurality of contact bodies on a semiconductor substrate, the contact bodies having a hydrophobicity dissimilar to that of the substrate, at least one of said contact bodies being insulated from the substrate by an insulating Langmuir-Blodgett (L-B) layer and at least one other contact body directly contacting the substrate surface, comprising:
   forming said at least one other contact body having a predetermined hydrophobicity,
   forming a substantially continuous L-B layer over the caps on said at least one other contact body and over the substrate at at least the intended location for said at least one insulated contact body, the hydrophobicity of said caps being sufficiently similar to that of the substrate to enable the formation of said L-B layer as a substantially continuous layer,
   forming said at least one insulated contact body over the L-B layer so that it is insulated from said substrate by said L-B layer, and
   removing the L-B layer except under said at least one insulated contact body.

15. The method of claim 14, wherein said substrate is formed from gallium arsenide and said caps are formed from nickel or another Group VIII metal having the same valence as nickel.

* * * * *